US009302430B2

(12) United States Patent
Thiel et al.

(10) Patent No.: US 9,302,430 B2
(45) Date of Patent: Apr. 5, 2016

(54) METHOD AND DEVICE FOR A SPATIALLY RESOLVED INTRODUCTION OF AN INTENSITY PATTERN COMPRISING ELECTRO-MAGNETIC RADIATION INTO A PHOTOSENSITIVE SUBSTANCE AS WELL AS APPLICATIONS THEREOF

(75) Inventors: Michael Thiel, Karlsruhe (DE); Holger Fischer, Karlsruhe (DE)

(73) Assignee: Nanoscribe GmbH, Eggenstein-Leopoldshafen (DE)

( * ) Notice: Subject to any disclaimer, the term of this patent is extended or adjusted under 35 U.S.C. 154(b) by 839 days.

(21) Appl. No.: 13/405,616

(22) Filed: Feb. 27, 2012

(65) Prior Publication Data

US 2012/0218535 A1 Aug. 30, 2012

(30) Foreign Application Priority Data

Feb. 25, 2011 (DE) .......................... 10 2011 012 484

(51) Int. Cl.
*B44C 1/22* (2006.01)
*B29C 67/00* (2006.01)
*G03F 7/004* (2006.01)

(52) U.S. Cl.
CPC .......... *B29C 67/0066* (2013.01); *G03F 7/0045* (2013.01)

(58) Field of Classification Search
CPC .. B29C 67/0066; G03F 7/0045; G03F 7/2041
USPC .............................. 216/62, 65, 66; 355/67, 72
See application file for complete search history.

(56) References Cited

U.S. PATENT DOCUMENTS

| 2005/0036183 A1* | 2/2005 | Yeo et al. .......................... 359/15 |
| 2008/0008955 A1* | 1/2008 | Brodsky .................. G03F 7/091 430/270.1 |

(Continued)

FOREIGN PATENT DOCUMENTS

| DE | 10024618 | 4/2001 |
| DE | 10111422 | 9/2002 |
| DE | 60114820 | 9/2006 |

(Continued)

OTHER PUBLICATIONS

Water Sphere Len; https://web.archive.org/web/20091022235540/http://www.exploratorium.edu/snacks/water_sphere_lens/index.html ; Oct. 22, 2009.*

(Continued)

*Primary Examiner* — Binh X Tran
(74) *Attorney, Agent, or Firm* — Volpe and Koenig, P.C.

(57) ABSTRACT

A method for the spatially resolved introduction of an intensity pattern of electro-magnetic radiation by at least one optic display system into a photosensitive substance having properties which can be changed by photon exposure. These properties include a first, liquid and at least one second state, with the electro-magnetic radiation being conducted via the optic display system into the photosensitive substance and here being projected on predetermined spatial coordinates, in order to create at or in an area of these spatial coordinates a change of the properties of the substance. A surface of an objective lens of the optic display system, through which the electro-magnetic radiation 4 is emitted, is immersed in the liquid photosensitive substance 2. A corresponding device is provided, and the device and method can be used for the creation of micro or nano-scaled structures.

12 Claims, 3 Drawing Sheets

(56) References Cited

U.S. PATENT DOCUMENTS

2008/0213689 A1* 9/2008 Kocsis ............... G03F 7/0045
  430/270.1
2010/0039628 A1* 2/2010 Shiraishi et al. ............... 355/30

FOREIGN PATENT DOCUMENTS

| | | |
|---|---|---|
| EP | 1616344 | 8/2008 |
| EP | 2067610 | 11/2011 |
| WO | 9006540 | 6/1990 |
| WO | 9200185 | 1/1992 |
| WO | 2011141521 | 11/2011 |

OTHER PUBLICATIONS

Wikipedia, The Free Encyclopedia, "Ultraviolet"; http://en.wikipedia.org/wiki/Ultraviolet; 2015.*

Day, Daniel et al., "Effects of Refractive-Index Mismatch on Three-Dimensional Optical Data-Storage Density in a Two-Photon Bleaching Polymer", Applied Optics, vol. 37, No. 26, Sep. 10, 1998, pp. 6299-6304.

* cited by examiner

METHOD AND DEVICE FOR A SPATIALLY RESOLVED INTRODUCTION OF AN INTENSITY PATTERN COMPRISING ELECTRO-MAGNETIC RADIATION INTO A PHOTOSENSITIVE SUBSTANCE AS WELL AS APPLICATIONS THEREOF

CROSS-REFERENCE TO RELATED APPLICATIONS

This application claims the benefit of German Patent Application No. 10 2011 012 484.5, filed Feb. 25, 2011, which is incorporated herein by reference as if fully set forth.

BACKGROUND

The invention relates to a method for the spatially resolved introduction of an intensity pattern comprising electro-magnetic radiation into a photosensitive substance with properties, which can be changed by photon radiation, as well as a device for implementing such a method. The present invention can particularly be used for writing, deleting, and rewriting an optic data carrier as well as for the formation of micro and nano-scaled structures. These applications and/or utilizations are included in the scope of the present invention.

The photosensitive substance used within the scope of the present invention shows as the initial status a first, liquid state and can change its properties by photon radiation into at least a second state. The change of this feature occurs such that electro-magnetic radiation is guided via an optic display system into the substance and is here projected on predetermined spatial coordinates, in order to create a change of the properties of the substance at these spatial coordinates and/or areas surrounding these spatial coordinates. The electro-magnetic radiation may particularly represent a collimated laser beam, without generally being limited thereto, which is projected by the optic display system on a volume with limited diffraction, thus in a focused fashion. The changes of the properties of the substance may be lasting, and for example represent a change of the liquid state into a solid one; for applications such as data storage the variation of the properties of the substance may also be only temporary and for example can be reversed by a thermal treatment of the substance or reverse automatically. For the rest, even a lasting change may be either reversible or non-reversible.

Within the scope of the present invention the first, liquid state of the photosensitive substance used shall not be understood exclusively as a liquid state, thus as the status of a substance in which it provides hardly any resistance to a change of shape and/or in case of a thickly-viscous fluid only a slight resistance, however poses a rather strong resistance to a change of volume, but the photosensitive substance may be present in its first, liquid state also as a paste, thus a mixture of solid and liquid matters, or a suspension with a high content of solid matter, which perhaps is no longer flowing or spreadable at all.

The electro-magnetic radiation used within the scope of the present invention usually represents light in the visible or infrared spectrum. When in the following for reasons of a simplified illustration and/or wording only "light beam", "light irradiation", or "exposure" is used, this shall be understood only as examples and does not exclude that perhaps also electro-magnetic radiation of other wavelengths can be used within the scope of the present invention.

Within the scope of the present invention the spatially resolved introduction of the electro-magnetic radiation occurs by an optic display, with the radiation being projected as an intensity pattern, particularly in a focused fashion. When in the following the term "focusing" is used, this represents an example for the introduction of optically projected intensity patterns of the electro-magnetic radiation into the photosensitive substance, because within the scope of the present invention projection of other intensity patterns may also be used in the image plane within the photosensitive substance.

A method and a device of the present type are generally used for the spatially resolved exposure (in the following also: writing) of one, two, or three-dimensional structures in the photosensitive substance, in order to particularly store data in a multi-dimensional fashion or to create multi-dimensional objects and/or structures and masks in the scale of nanometers and micrometers.

In the field of stereo-lithography for the creation of structures in the macro-range, for example, it was suggested in DE 101 11 422 A1 to introduce a light beam into a liquid photosensitive substance and to focus it here, so that the substance transformed from its liquid into a solid state. This change of the properties of the substance occurs in the ideal case precisely in the area of said focus. This may be achieved both by a linear as well as by a non-linear effect: either the substance reacts linearly, but shows an intensity limit, below which any change by irradiation cannot occur or only to an insufficient extent, or the substance reacts in a non-linear fashion, which is particularly the case in two or multi-photon polymerization. In the latter method the probability for changing properties of the substance in the focus is amplified by the here increased intensity in reference to the environment.

The precise, spatially resolved introduction of a focused light beam into a photosensitive substance is particularly suitable for the production of a three-dimensional structure when the change of the substance is caused relatively precisely and exclusively in the focus. Because due to suitable display systems, for example Piezo-lifts, for moving the substrate or the beam deflecting devices, such as galvanoscope, micro-mirror actuators, spatial modulators for light, or acousto-optic deflectors the focus can range over a relatively large, three-dimensionally extended writing area in the photosensitive substance. This is rather irrelevant for stereo-lithographic methods, such as the one known from DE 101 11 422 A1, but is interesting particularly for the production of nano and micro-scaled structures, light wave conductors, or spatially disbursed, writable optic data storage units, in which a primary aspect is given to the high resolution of the structures and thus objective lenses must be used in connection with immersion means. In order to overcome the diffraction limit here, which depends on the wavelength of the light used and the Abbe limit, it has been suggested in EP 1 616 344 B1 to incite the spatially resolved changes of the properties of the substance by a diffraction-limited signal and to simultaneously and spatially cancel this change using an off-set diffraction limited signal.

In case of a change of the spatial coordinates along the optic axis of the optic display system used the problem develops however, like everywhere in the field of displaying optics, that display errors or aberrations occur, with their number growing with increased writing depth, thus with an increasing portion of material in the optic path not optimally adjusted to the diffraction index. Therefore, in prior art three-dimensional structures can be created with an only very limited height.

A method is already known for the field of two and multi-photon absorption lithography, which attempts to statically compensate the problem of display errors by utilizing preliminary compensation. In the publication APPLIED OPTICS, volume 27, number 26 (1998), a method is described, which uses two tubular lenses, which can be displaced along the optic axis. By a relative displacement of the tubular lenses aberrations of all orders are created, which can be selected such that they partially compensate particularly the errors of the subsequent optic system. This method allows an only partial compensation of aberrations and is technically extremely complicated, because additional components are used, which in turn are subject to errors and must be moved. Additionally, for each irradiation level along the optic axis a new relative position of the tubular lenses must be adjusted. Furthermore, due to the use of the tubular lenses the display shifts along the optic axis such that the compensated display is extended or compressed. Under certain circumstances, additionally the irradiated dosage of light may be changed in the compensated display, which has disadvantageous effects upon the resulting structures.

SUMMARY

Starting from this prior art, the present invention is based on the objective to largely avoid the display errors in a method and a device of the present type or to essentially keep them constant along the optic axis of the display system.

This objective is attained in a method as well as a device according to the invention. Advantageous further developments of the method according to the invention as well as preferred embodiments of the device according to the invention are described in the specification and claims.

According to the invention, the object is met in that the objective lens of the optic display system and/or a surface of the objective lens, by which the electro-magnetic radiation, particularly a light beam, emitted from the optic display system, is dipped into contact with the liquid photosensitive substance, in which the change of the properties of the substance shall be created. The photosensitive substance therefore operates as an immersion system such that by the use of suitable immersion objective lenses the display errors can largely or almost completely be eliminated. Even when the diffraction index of the objective lens and the photosensitive substance is not ideally adjusted, the invention still leads to much better results than previously achieved, because here the aberrations are constant, independent from the writing depth, and the display in the overall writing area is identical.

A primary reason for these effects according to the invention is given in the fact that the boundary or boundaries always present in prior art between the photosensitive substance and the objective lens of the optic display system is/are essentially omitted. Because such boundary (boundaries) generally leads (lead) to display errors.

Using the method according to the invention these deviations from an ideal optic display are avoided, with the photosensitive substance simultaneously serving as an immersion means, with a signal, thus the focus or another intensity pattern of the electro-magnetic radiation irradiated via the optic display system, such as a light beam, being projected on the writing area within the photosensitive substance such that the distance between the objective lens and the image level of the signals in the writing area assumes a constant value. Aberrations caused by an adjustment of errors of the diffraction index of the optic system remain constant along the optic axis (and in the ideal case they are zero) and the photosensitive substance can be exposed in the entire writing area with identical focus and/or patterns of intensity.

For the rest, another major advantage of the present invention comprises that the extension of the spatial coordinates that can be projected in the direction of the optic axis of the display system is no longer limited by the operating distance of the objective lens. Because according to the invention, the objective lens is dipped directly in the photosensitive substance when projecting, particularly focusing the light bean to the predetermined spatial coordinates. This way, three-dimensional structures can be written into the photosensitive substance, with their extension in the direction of the optic axis being much greater and thus much higher than the structures that can be produced according to prior art, namely potentially upholding the highest spatial resolution.

The method according to the invention and the respective device are preferably used to create one, two, and three-dimensional structures in a writing area inside the photosensitive substance.

In a preferred variant of the novel method the writing signal comprises and/or the writing signals comprise (several signals may be required, for example, in case of STED lithography described according to the above-mentioned DE 101 11 422 A1) radiation from the visible or near-infrared electro-magnetic spectrum. The light source may be a pulsed laser or a continuous wave laser, for example. Additionally, electro-magnetic radiation of the UV-range or medium or long-infra-red range may also be selected. Further, the irradiation mechanism may be (photo) chemical and/or thermal, for example.

With the present invention, an optic system may be used to create optic data storage units with constant aberrations or without aberrations showing particularly few display errors. By the selection of a suitable photo-sensitive substance such an optic data storage can be written, deleted, and rewritten.

Additionally, micro and nano-structures with otherwise unachievable precision can be produced over the entire writing area inside a photosensitive substance.

Using a layered construction of the one-, two, or three-dimensional structure to be created in the photosensitive substance it can be avoided that any already pre-structured material is irradiated and/or written upon. Because usually the diffraction index of the photosensitive substance changes when it is modified based on photon exposure. This may lead to additional display errors, when the light beam is focused and/or projected through a modified material into the photo-sensitive substance.

Preferably, the liquid photosensitive substance is applied on a solid body used as the substrate, for example a glass plate or another arbitrarily shaped, perhaps also opaque body, and then the optic display system is dipped in the liquid photosensitive substance. The substrate is therefore not located between the photosensitive substance and the optic display system so that here additional display errors are avoided by boundaries and the height of the structures to be written is not limited by the operating distance of the objective lens of the display system.

According to a further development of this variant of the invention a transparent, disk-shaped or plate-shaped solid body is used as a substrate, which carries a liquid photosensitive substance on both sides. On the side of the substrate facing the optic display system the photosensitive substance then serves as an immersion means according to the invention, with the light beam cannot only be focused in the photosensitive substance acting simultaneously as an immersion means but, if necessary, also passing through this substance and the substrate into the photosensitive substance applied on the side of the substrate facing away. The alignment of structures on both sides of the substrate according to the invention is possible with much higher precision than in previous prior art because in a single step directly both sides of the substrate can be structured. The rotating and aligning of the substrate required according to prior art is not necessary, here.

A laser, particularly a continuous wave laser or a pulsed laser in the electro-magnetic spectrum of UV, visible light, or near-infrared is used as the radiation source for the electro-magnetic radiation and/or the light source for the present invention. Within the scope of the present invention, the liquid photosensitive substance can be spatially modified in a physical, thermal, and/or chemical manner by way of photon exposure.

The change of the properties of the photosensitive substance can be initiated and/or cancelled by a one-photon process or a multi-photon process, as known from prior art.

As already mentioned, the device and the method according to the invention can be used particularly and advantageously for writing and/or deleting data storage units as well as for creating micro or nano-scaled structures. In the latter case, points or areas of the photosensitive substance modified by photon absorption can subsequently be released or removed by a selective development process.

The present invention is based on the acknowledgement that the intensity pattern of the electro-magnetic irradiation projected in the photosensitive substance, particularly the focus of a light-beam, compounds errors with increasing writing depth, thus an increasing depth of penetration into the photosensitive substance adjusted to diffraction along the optic axis of the display system and thus a precise spatial resolution is no longer possible. The display errors intensify with increased variety of the diffraction indices between the photosensitive substance and the air and/or a substrate, when irradiation occurs through such a material. The display errors are not necessarily avoided according to the invention, but only kept constant or at least essentially constant within a writing area along the optic axis of the display system so that a highly precise spatial resolution can be achieved within the photosensitive substance.

BRIEF DESCRIPTION OF THE DRAWINGS

In the following, an exemplary embodiment for a device according to the invention as well as test results for a method performed according to the invention are described and explained in greater detail based on the attached drawings. Shown are.

DETAILED DESCRIPTION OF THE PREFERRED EMBODIMENTS

Figure 1:
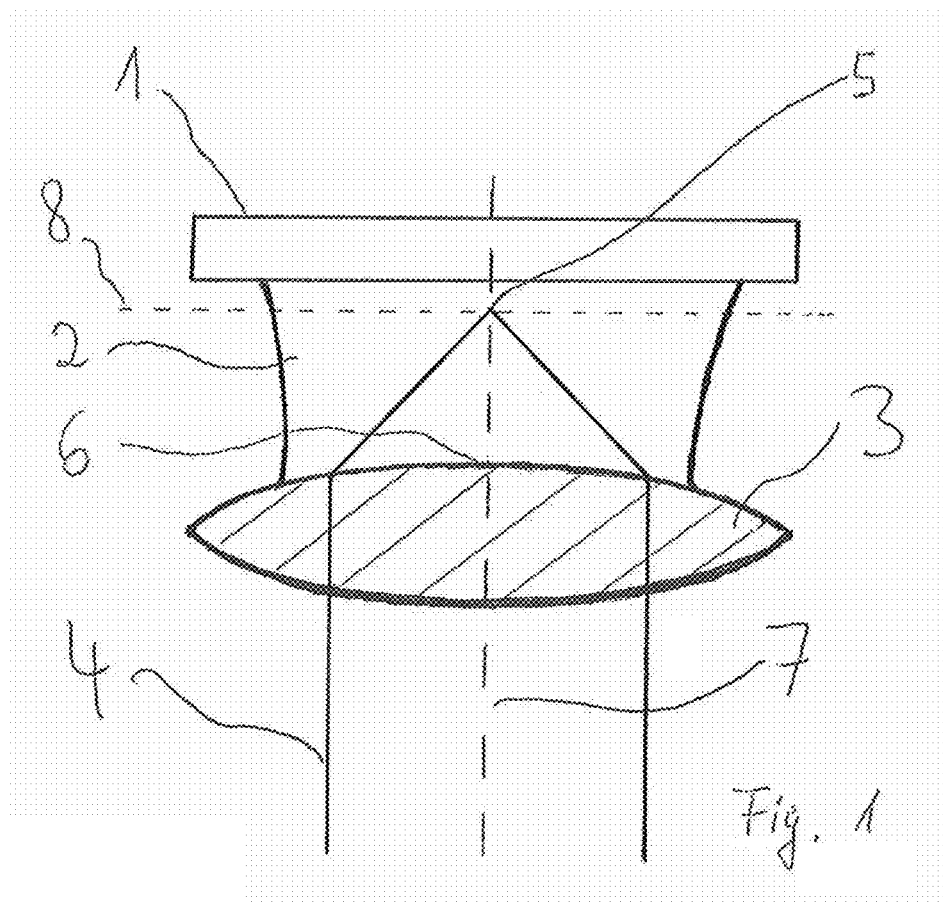
FIG. 1 is a schematic illustration of an arrangement of parts of the device essential for the invention.

FIG. 1 shows a schematic illustration of the core of the present invention. A liquid, photosensitive substance 2 is located on a substrate 1, which here comprises a liquid photo lacquer system known from lithography showing a diffraction index ranging from n~1.3 to n~1.7. A light source (not shown), here a pulsed laser in the near-infrared range, is projected via an optic display system, for example a microscope, comprising an objective lens 3 in the photosensitive substance 2, here indicated by a light beam 4, and focused in a focus 5 in an image level 8, in order to cause in the area of the focus 5 the change of the properties of the photosensitive substance 2. The light beam 4 is emitted from a surface 6 of an objective lens 3, with according to the invention this surface 6 being dipped in the photosensitive substance 2, in order to avoid any potential intermediate boundaries.

The objective lens 3 is an immersion objective lens, such objective lenses are typically produced for the diffraction indices of oils (n~1.5-1.7), glycerin (n~1.47), or water (n~1.3). When in this configuration the objective lens is adjusted to the diffraction index of the photo resist 2, in principle the image level 8 can be displaced along the optic axis 7 and projected and structured with constant aberrations. The display can particularly represent a Gauss-focus. In the normal case of a small difference between the diffraction index, for which the objective 3 operates ideally, and the diffraction index of the photosensitive substance 2 it cannot be structured without any aberration errors, however this error is constant over the entire writing depth along an optic axis 7, which even in a system not perfectly adjusted leads to considerable improvements of writing quality in reference to prior art. This is apparent based on the FIGS. 2 and 3 described in the following.

Figure 2:
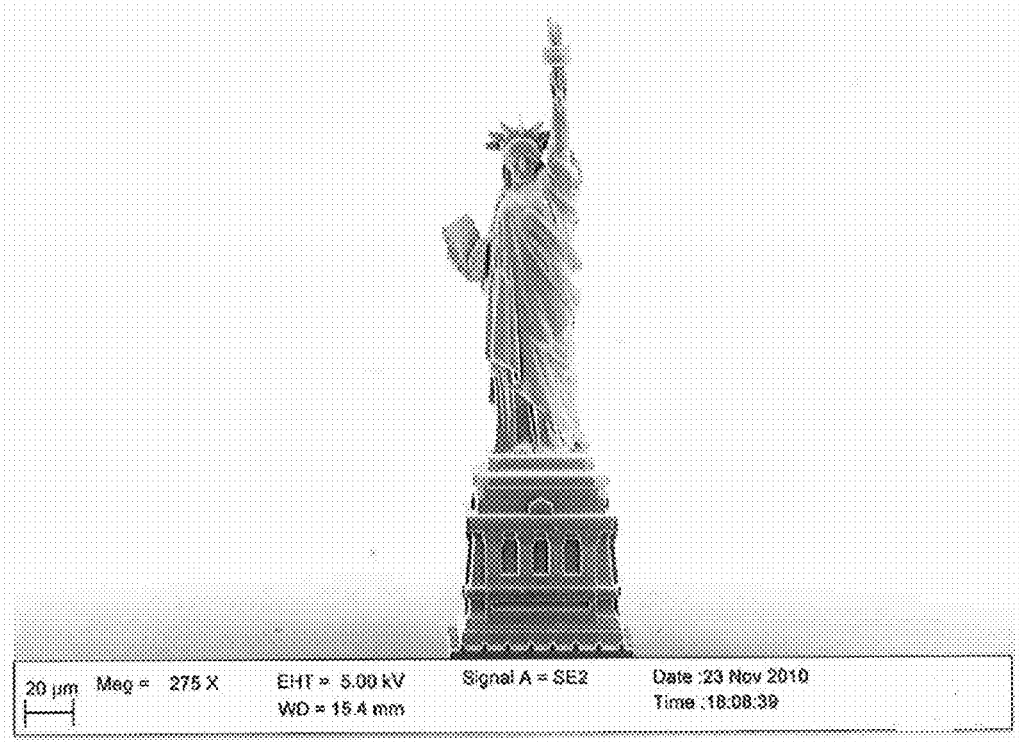
FIG. 2 is an illustration of a three-dimensional microstructure produced with the method according to the invention.

FIG. 2 shows the illustration of a three-dimensional structure, which is formed in an arrangement according to FIG. 1 by writing in IP-L and subsequent development of the photosensitive substance. Here, an oil-objective lens was used for the diffraction index n~1.52 and a photo resist with the diffraction index n~1.48. The source, as easily discernible, is the New York Statue of Liberty, which has been written into the photosensitive substance with an overall size of approx. 300 μm.

Figure 3:
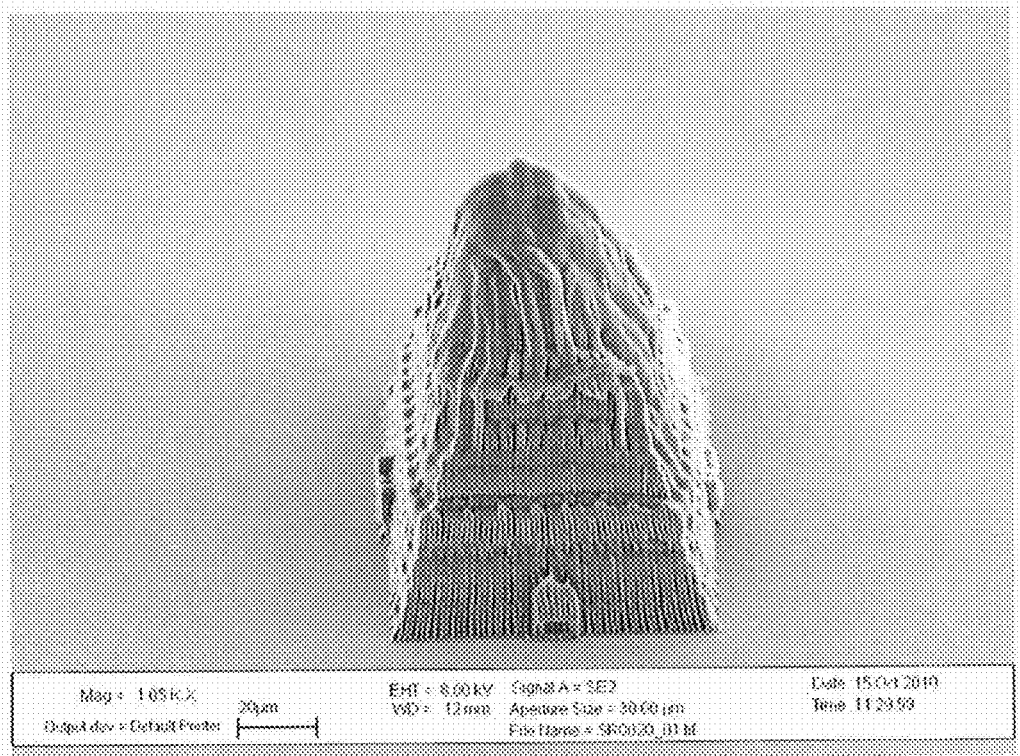
FIG. 3 is an illustration of a three-dimensional microstructure, produced according to prior art, according to the same pattern as FIG. 3.

Even in the structure displayed in FIG. 3 the source was the Statue of Liberty in an overall height of approx. 300 μm, however, since here a method of prior art was used, it could not be projected with the necessary precision in the photosensitive substance.

Figure 4:
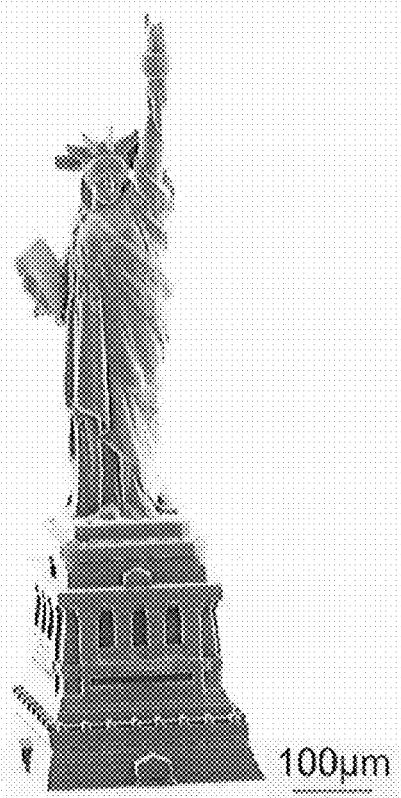
FIG. 4 is another illustration of a microstructure produced based on the method according to the invention.

FIG. 4 shows again the illustration of a three-dimensional structure, which was formed in an arrangement according to FIG. 1 equipped according to the invention. Similar to FIG. 2, here too the Statue of Liberty of New York has been exposed as the three-dimensional structure. However, as discernible from the scale in FIG. 4, a considerably larger structure was written. The Statue of Liberty shows an unchanged, high resolution in reference to FIG. 2 and accordingly it displays details to a much higher extent; its overall height amounts to approximately 1 mm. This example, which is shown in FIG. 4, illustrates that by the present invention three-dimensional structures can be written into the photosensitive substance, with their extension in the direction of the optic axis being greater than the operating distance of the objective lens used for writing and/or irradiating. And this is done with the utmost spatial resolution, as discernible.

Figure 5:
FIG. 5 is another illustration according to a microstructure produced via the method according to the invention.

FIG. 5 ultimately illustrates another example for a three-dimensional structure created by photo-lithography using the method according to the invention, with this structure showing an overall height of approx. 200 μm as well as attention to detail in the spatial resolution previously unachieved, in spite of this overall height.

The invention claimed is:

1. A method for a spatially resolved insertion of an intensity pattern comprising electro-magnetic radiation via an optic display system in a photosensitive substance having properties that are modifiable by photon exposure, including a first liquid state and at least one second state, the method comprising:

dipping a surface (6) of a solid immersion objective lens of the optic display system (3), from which electro-magnetic radiation (4) is emitted, directly into contact with the liquid photosensitive substance;

conducting the electro-magnetic radiation (4) via the optic display system (3) into the photosensitive substance (2), and projecting the intensity pattern (5) via the optic display system (3) on predetermined spatial coordinates on an image level (8) within the photosensitive substance in order to create at the predetermined spatial coordinates or in areas surrounding the predetermined spatial coordinates a change of the properties of the photosensitive substance.

2. The method according to claim 1, wherein projection of the intensity pattern occurs by focusing the electro-magnetic radiation on the predetermined spatial coordinates.

3. The method according to claim 1, wherein the liquid photosensitive substance (2) is spatially modified in at least one of a physical, thermal, or chemical manner by way of photon irradiation.

4. The method according to claim 1, wherein the change of the properties of the photosensitive substance (2) is at least one of initiated or cancelled by a one-photon process or a multi-photon process.

5. The method according to claim 1, wherein a three-dimensional structure is written into the photosensitive substance (2) with the intensity pattern of the electro-magnetic radiation (4).

6. The method according to claim 5, wherein the three-dimensional structure is sequentially or simultaneously written with several patterns of intensities projected and using one or more optic display systems.

7. The method according to claim 1, wherein the liquid photosensitive substance (2) is applied on a solid body used as a substrate (1) and then the surface of the solid immersion objective lens of the optic display system (3) is dipped into contact with the liquid photosensitive substance (2).

8. The method according to claim 7, wherein a transparent, disk-shaped or plate-shaped solid body is used as the substrate (1) and the liquid photosensitive substance (2) is applied onto the substrate (1) on both surfaces.

9. The method according to claim 1, wherein a laser is used as a source for the electro-magnetic radiation (4).

10. The method according to claim 9, wherein the laser is a continuous wave laser or a pulsed laser in the electro-magnetic spectrum of UV, visible light, or near-infrared.

11. The method according to claim 1, further comprising creating micro or nano-scaled structures.

12. The method according to claim 11, wherein points or areas of the photosensitive substance (2) modified by photon exposure are subsequently released or removed by a selective development process.

\* \* \* \* \*